(12) United States Patent
Seo et al.

(10) Patent No.: US 9,184,236 B2
(45) Date of Patent: Nov. 10, 2015

(54) METHOD OF TRANSFERRING GRAPHENE USING TRENCH AND SUBSTRATE FOR RECEIVING GRAPHENE

(75) Inventors: David Seo, Yongin-si (KR); Jin-seong Heo, Suwon-si (KR); Hyun-jong Chung, Hwaseong-si (KR); Hee-jun Yang, Seoul (KR); Seong-jun Park, Seoul (KR); Hyun-jae Song, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 241 days.

(21) Appl. No.: 13/589,650

(22) Filed: Aug. 20, 2012

(65) Prior Publication Data

US 2013/0065022 A1 Mar. 14, 2013

(30) Foreign Application Priority Data

Aug. 19, 2011 (KR) .......... 10-2011-0083054

(51) Int. Cl.
*H01L 29/16* (2006.01)
*H01L 21/20* (2006.01)

(52) U.S. Cl.
CPC ........ *H01L 29/1606* (2013.01); *H01L 21/2007* (2013.01); *Y10T 156/10* (2015.01); *Y10T 428/2457* (2015.01); *Y10T 428/24612* (2015.01)

(58) Field of Classification Search
CPC .... H01L 29/1606; B82Y 10/00; B82Y 40/00; C01B 2204/02

USPC .......... 156/151, 152, 155, 230, 247, 249, 292
See application file for complete search history.

(56) References Cited

U.S. PATENT DOCUMENTS

| 2010/0021708 | A1 | 1/2010 | Kong et al. |
| 2011/0030879 | A1* | 2/2011 | Veerasamy ............... 156/99 |
| 2013/0217222 | A1* | 8/2013 | Johnson et al. ............... 438/610 |

FOREIGN PATENT DOCUMENTS

| JP | 2010-153793 A | 7/2010 |
| KR | 20090028007 A | 3/2009 |
| KR | 20090065206 A | 6/2009 |
| KR | 10-2011-0052300 A | 5/2011 |

OTHER PUBLICATIONS

Bao et al., Nature Nanotechnology Jul. 26, 2009, Controlled ripple texturing of suspended graphene and ultrathin graphite members, Macmillan Publishers Limited, pp. 562-566.*
Mark Levendorf et al., "Transfer-Free Batch Fabrication of Single Layer Graphene Transistors," *Nano Letters*, 2009, vol. 9, No. 12, pp. 4479-4483.

(Continued)

*Primary Examiner* — Scott W Dodds
(74) *Attorney, Agent, or Firm* — Harness, Dickey & Pierce, P.L.C.

(57) ABSTRACT

A method of transferring graphene includes patterning an upper surface of a substrate to form at least one trench therein, providing a graphene layer on the substrate, the graphene layer including an adhesive liquid thereon, pressing the graphene layer with respect to the substrate, and removing the adhesive liquid by drying the substrate.

11 Claims, 3 Drawing Sheets

(56) References Cited

OTHER PUBLICATIONS

Youngbin Lee et al., "Wafer-Scale Synthesis and Transfer of Graphene Films," *Nano Letters*, 2010, vol. 10, pp. 490-493.

Lee, et al. "Study on Anti-Oxidation Characteristics of Graphene by Using Thermal Plasma Oxidation" Korean Vacuum Society, p. 78, 2010 (English Abstract Provided).

* cited by examiner

METHOD OF TRANSFERRING GRAPHENE USING TRENCH AND SUBSTRATE FOR RECEIVING GRAPHENE

CROSS-REFERENCE TO RELATED APPLICATIONS

This application claims the benefit of Korean Patent Application No. 10-2011-0083054, filed on Aug. 19, 2011, in the Korean Intellectual Property Office, the disclosures of which is incorporated herein in its entirety by reference.

BACKGROUND

1. Field

Some example embodiments relate to methods of transferring graphene using a substrate having a trench for drying graphene.

2. Description of the Related Art

Graphene having a 2-dimensional hexagonal carbon structure is a material that may replace semiconductors. Graphene is a zero gap semiconductor. When a graphene nano-ribbon (GNR) having a graphene channel width of 10 nm or less is formed, a band gap is formed by a size effect. Accordingly, a field effect transistor that may be operated at room temperature may be manufactured using the GNR.

Also, graphene has a mobility of 100,000 $cm^2V^{-1}s^{-1}$ at room temperature, which is approximately 100 times higher than that of silicon. Thus, graphene may be applied to high-frequency devices, for example, radio frequency (RF) devices. Graphene may be manufactured by a chemical vapor deposition (CVD) method or thermal decomposition of a silicon carbide (SiC) substrate.

In the CVD method, graphene may be grown by supplying a carbon-containing material onto a catalyst layer in a CVD chamber. Graphene manufactured in this way may be referred to as CVD graphene. In order to manufacture an electronic device using the CVD graphene, after removing the catalyst layer under the CVD graphene, the CVD graphene needs to be transferred to a substrate for receiving graphene. When the CVD graphene is transferred onto the substrate, voids may be caused between the graphene and the substrate in a drying process of the CVD graphene, and thus, the CVD graphene may be in a relatively high roughness state, that is, an uneven state with respect to the substrate. Accordingly, the CVD graphene may be difficult to apply to an electronic device.

SUMMARY

Some example embodiments provide methods of transferring graphene to a substrate for receiving graphene using a trench with low roughness. Additional aspects will be set forth in part in the description which follows and, in part, will be apparent from the description, or may be learned by practice of the presented embodiments.

According to an example embodiment, a method of transferring graphene includes patterning an upper surface of a substrate to form at least one trench therein, providing a graphene layer on the substrate, the graphene layer including an adhesive liquid thereon, pressing the graphene layer with respect to the substrate, and removing the adhesive liquid by drying the substrate.

The adhesive liquid may include at least one selected from a group consisting of deionized (DI) water, isopropyl alcohol (IPA), ethanol, methanol, and mineral oil. The at least one trench may include a plurality of trenches. The patterning may form the plurality of trenches parallel to each other. Both edges of each of the plurality of trenches may extend towards a circumference of the substrate when viewed from a plan view.

At least one pair of neighboring trenches of the plurality of trenches may be connected by grooves therebetween. Each of the plurality of trenches may have a width in a range of about 1 μm to about 1000 μm. At least one pair of neighboring trenches of the plurality of trenches may have a pitch in a range of about 0.1 cm to about 10 cm.

Providing the graphene layer may include sequentially stacking a protective layer and a supporting layer on the graphene layer. The protective layer may include at least one material selected from a group consisting of poly methyl methacrylate (PMMA), photoresist (PR), electron resist (ER), silicon oxide (SiOx), and aluminum oxide (AlOx). The supporting layer may include at least one material selected from a group consisting of an adhesive tape, a thermal release tape, and an ultraviolet (UV) tape.

Pressing the graphene layer may include sliding a roller on the supporting layer to press the adhesive liquid into the plurality of trenches. The substrate may include at least one selected from a group consisting of a silicon-on-insulator (SOI) substrate, a plastic substrate, and a glass substrate.

According to another example embodiment, a substrate structure may include a substrate including a plurality of trenches therein, and a graphene layer on the substrate.

The plurality of trenches may be parallel to each other. Both edges of each of the plurality of trenches may extend towards a circumference of the substrate when viewed from a plan view. At least one pair of neighboring trenches of the plurality of trenches may include a groove therebetween configured to connect the plurality of trenches in the substrate.

Each of the plurality of trenches may have a width in a range of about 1 μm to about 1000 μm. At least one pair of neighboring trenches of the plurality of trenches may have a pitch in a range of about 0.1 cm to about 10 cm. The substrate may include at least one selected from a group consisting of a silicon-on-insulator (SOI) substrate, a plastic substrate, and a glass substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
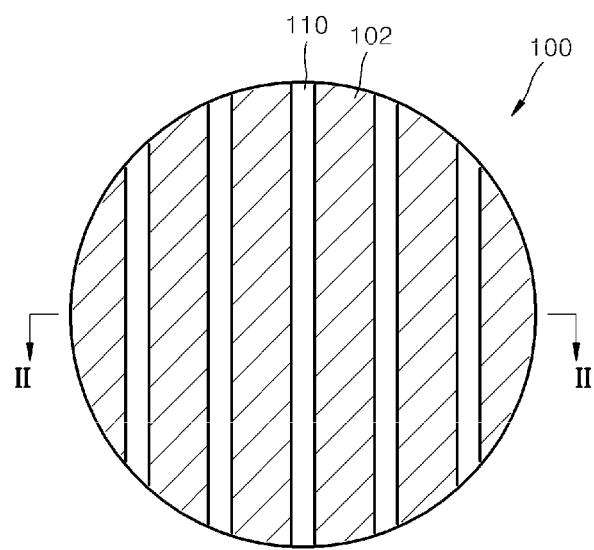
FIG. 1 is a plan view of a substrate for receiving graphene in a method of transferring graphene, according to an example embodiment.

Reference will now be made in detail to embodiments, examples of which are illustrated in the accompanying drawings. In the drawings, thicknesses of layers and regions are exaggerated for clarity. Like reference numerals in the drawings denote like elements throughout the specification, and thus, the detailed descriptions thereof will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
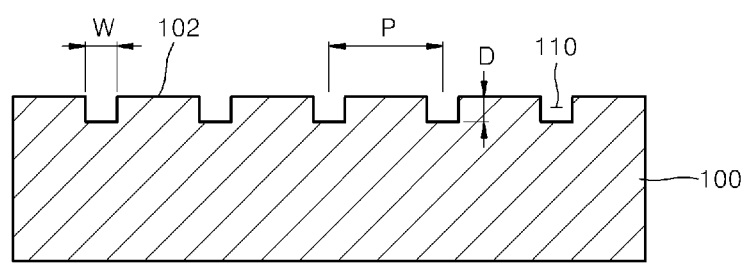
FIG. 2 is a cross-sectional view taken along the line II-II' of FIG. 1.

FIGS. 1 through 6 schematically illustrate a method of transferring graphene, according to an example embodiment. FIG. 1 is a plan view of a substrate 100 for receiving graphene in a method of transferring graphene, according to an example embodiment and FIG. 2 is a cross-sectional view taken along the line II-II' of FIG. 1. The substrate 100 for receiving graphene may be a circular type wafer that is used in a semiconductor process, and, hereinafter, for convenience, is referred to as the substrate 100.

Referring to FIGS. 1 and 2, a plurality of trenches 110 parallel to each other are formed on a surface of the substrate 100. The trenches 110 may be patterned by a photolithography method and an etching method, which are conventionally known. For example, after forming an etch mask by patterning a photoresist using a photolithography method, the trenches 110 may be formed in the substrate 100 by using an etching method such as a reactive ion etching (RIE) method.

In FIG. 1, the trenches 110 are formed parallel to each other. However, example embodiments are not limited thereto, and the trenches 110 may not be parallel to each other. Both edges of the trenches 110 extend to the circumference of the substrate 100. Both edges of each of the trenches 110 may be a discharge path of an adhesive liquid which will be described later. The adhesive liquid may be deionized (DI) water, isopropyl alcohol, ethanol, methanol, or mineral oil, etc.

The substrate 100 may be a silicon-on-insulator (SOI) substrate, a plastic substrate, or a glass substrate. An insulating layer of the SOI substrate may be formed of an insulating material such as $SiO_2$ or SiN.

The trenches 110 may have a width W in a range of about 1 μm to about 1000 μm. The width W of the trenches 110 may vary according to the adhesive liquid used. For example, if alcohol is used as the adhesive liquid, the width W may be in a range of about 1 μm to about 1000 μm, and if DI water or mineral oil is used, the width W may be in a range of about 30 μm to about 1000 μm. The trenches 110 may have a depth D that is approximately the same size as the width W of the trenches 110.

The trenches 110 may have a pitch P in a range of about 0.1 cm to about 10 cm. The pitch P of the trenches 110 may be designed to meet a size of chips to be formed on the substrate 100. That is, graphene is transferred onto an upper surface of the substrate 100. When the chips are formed using the graphene, the trenches 110 may be used as dicing regions in a subsequent process. In this case, a width of an upper surface 102 between two trenches 110 may be greater than that of at least one of the chips to be formed thereon.

Figure 3:
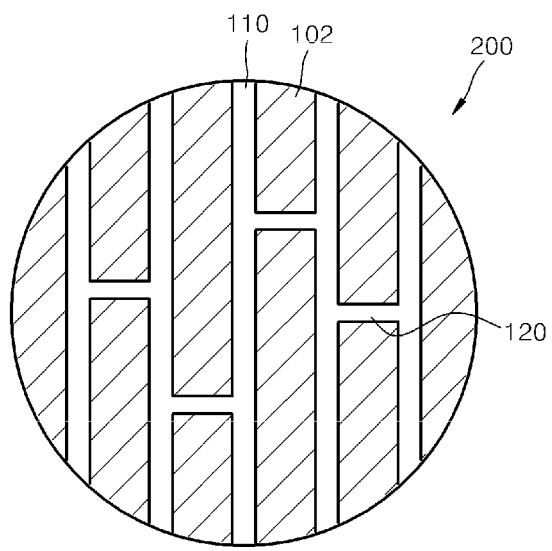
FIG. 3 is a plan view of a substrate for receiving graphene as a modified version of the substrate for receiving graphene of FIG. 1, according to another example embodiment.

FIG. 3 is a plan view of a substrate 200 for receiving graphene as a modified version of the substrate 100, according to another example embodiment. In FIG. 3, like reference numerals are used to indicate elements that are substantially identical to the elements of FIG. 1, and thus, the detailed description thereof will not be repeated.

Referring to FIG. 3, grooves 120 may be formed between neighboring trenches 110. The grooves 120 may provide various discharge paths of the adhesive liquid by connecting the trenches 110.

Figure 4:
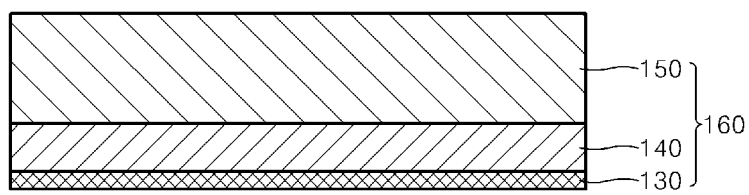
FIG. 4 is a cross-sectional view of a graphene structure including graphene to be transferred, according to an example embodiment.

FIG. 4 is a cross-sectional view of a graphene structure 160 that includes graphene to be transferred, according to an example embodiment. Referring to FIG. 4, a protective layer 140 and a supporting layer 150 are sequentially stacked in a stated order on an upper surface of a graphene layer 130. Hereinafter, a structure including the graphene layer 130, the protective layer 140, and the supporting layer 150 is referred to as the graphene structure 160. The graphene layer 130 may be formed by a conventional method, for example, a chemical vapor deposition (CVD) method using a source gas that contains carbon, such as $CH_4$, $C_2H_2$, $C_2H_4$, or CO on a catalyst layer. The graphene layer 130 manufactured in this way is referred to as a CVD graphene layer. The graphene layer 130 may be formed as a mono-layer or a bi-layer. The graphene layer 130 may be formed to have a thickness in a range of about 0.3 nm to about 2 nm.

The protective layer 140 may prevent or inhibit the graphene layer 130 from tearing or being corrugated during a transferring process. The protective layer 140 may be formed of poly methyl methacrylate (PMMA), photoresist (PR), electron resist (ER), silicon oxide (SiOx), or aluminum oxide (AlOx). The protective layer 140 may be formed to have a thickness in a range of about 200 nm to about 10 μm using a spin coating method in a relatively low temperature process at a temperature below 100° C.

The supporting layer 150 is formed on the protective layer 140. The supporting layer 150 may be formed of an adhesive tape, glue, epoxy resin, a thermal-release tape, a water-soluble tape, or an ultraviolet (UV) tape to a thickness in a range of about 100 μm to about 200 μm. The supporting layer 150 supports the graphene layer 130 when the graphene layer 130 is physically separated from a substrate (not shown) that is used for manufacturing the graphene layer 130. The supporting layer 150 provides a thickness for gripping when the graphene layer 130 is moved.

Figure 5:
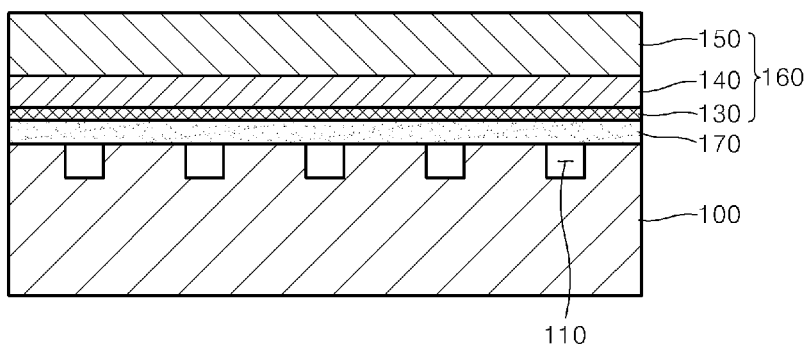
FIG. 5 is a cross-sectional view of a graphene structure disposed on a substrate.

FIG. 5 is a cross-sectional view of the graphene structure 160 disposed on the substrate 100. Referring to FIG. 5, the adhesive liquid 170 is sprayed onto the graphene layer 130. The adhesive liquid 170 may be DI water. However, isopropyl alcohol, ethanol, methanol, or mineral oil may also be used as the adhesive liquid 170 instead of DI water. Also, after dipping the graphene structure 160 that includes the graphene layer 130 in the adhesive liquid 170, the graphene structure 160 may be arranged so that the graphene layer 130 faces the substrate 100.

Figure 6:
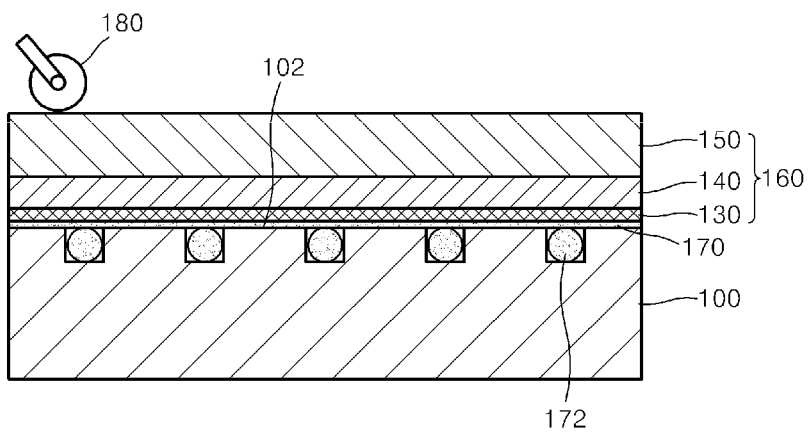
FIG. 6 is a schematic drawing showing an operation of discharging an adhesive liquid disposed on graphene to trenches by using a pressing device.

FIG. 6 is a schematic drawing showing an operation of discharging the adhesive liquid 170 disposed on the graphene layer 130 to the trenches 110 by using a pressing unit. Referring to FIG. 6, the adhesive liquid 170 adhered onto the graphene layer 130 is pushed into the trenches 110 as droplets 172 by pressing the graphene structure 160. This process is a primary removal of the adhesive liquid 170. As depicted in FIG. 6, a roller 180 is used as the pressing unit. The graphene structure 160 may be pressed by rolling the roller 180 on the graphene structure 160. As another method, the graphene structure 160 may be pressed with respect to the substrate 100 from above the graphene structure 160 by using a pressing unit (not shown). The droplets 172 of the adhesive liquid 170 in the trenches 110 are discharged to the outside through both edges of the trenches 110.

The substrate 100 is placed in a drying chamber (not shown). The drying chamber is maintained at a temperature that may evaporate the adhesive liquid 170. For example, when DI water is used as the adhesive liquid 170, the drying chamber may be maintained at a temperature of approximately 90° C. After drying for approximately 6 hours, the DI water adhered to the graphene layer 130 may be discharged to the outside through the trenches 110. In the evaporation process of DI water, a gap between the graphene layer 130 and the substrate 100 is gradually reduced, and the graphene layer 130 is attached to the upper surface 102 of the substrate 100.

While evaporating the adhesive liquid 170 in the trenches 110, the Van der Waals force between the graphene layer 130 and the upper surface 102 of the substrate 100 is increased. Accordingly, the graphene layer 130 is evenly attached to the substrate 100. Also, the surface tension of the adhesive liquid 170 facilitates the adhesion of the graphene layer 130 to the substrate 100 and improves the roughness of the graphene layer 130.

The graphene layer 130 over the trench 110 may be torn when the graphene layer 130 is pulled down into the trenches 110 by the Van der Waals force. Accordingly, the graphene in the trenches 110 may not be used as a material for electronic devices. The graphene in the trenches 110 may be removed when graphene is used for manufacturing electronic devices, or the trenches 110 may be included in dicing regions. The graphene layer 130 on the upper surface 102 of the substrate 100 may be used for manufacturing electronic devices.

The supporting layer 150 and the protective layer 140 are removed. The removal of the supporting layer 150 and the protective layer 140 may be achieved by etching using an organic solvent, ion milling, or annealing according to the materials used to form the supporting layer 150 and the protective layer 140, and a detail description thereof will be omitted. The organic solvent may be acetone, chlorobenzene, or toluene, etc. However, the organic solvent according to an example embodiment is not limited thereto, and any organic solvent that may dissolve and remove the supporting layer 150 and the protective layer 140 may be used.

The graphene layer 130 is washed using isopropyl alcohol or DI water to remove chemical residues from the graphene layer 130. The graphene layer 130 manufactured by the above method may be used in manufacturing electronic devices, for example, field effect transistors, RF transistors, transparent electrodes, or spin devices.

In a conventional method of transferring graphene, when an adhesive liquid is removed by drying the graphene on a substrate on which trenches are not formed, the path of the adhesive liquid to be evaporated is limited to edges of the graphene layer. Therefore, drying time is increased, and also, due to the formation of voids between the graphene layer and the substrate, the roughness of the graphene layer is increased.

According to an example embodiment, when a graphene layer is transferred to a substrate for receiving graphene, an adhesive liquid is gradually evaporated using trenches. Therefore, drying time may be greatly reduced, and the graphene layer may be transferred to the substrate having relatively low roughness. Productivity for manufacturing electronic devices that use the graphene layer may be increased.

While the inventive concepts have been particularly shown and described with reference to example embodiments thereof, it will be understood by those of ordinary skill in the art that various changes in form and details may be made therein without departing from the spirit and scope of the appended claims.

What is claimed is:

1. A method of transferring graphene, the method comprising:
   patterning an upper surface of a substrate to form at least one trench therein;
   providing a graphene layer on the substrate, the graphene layer including an adhesive liquid thereon, wherein the providing sequentially stacks a protective layer and a supporting layer on the graphene layer and wherein the adhesive liquid is included only on a surface of the graphene layer facing the substrate;
   pressing the graphene layer with respect to the substrate by sliding a roller on the supporting layer to press the adhesive liquid into the plurality of trenches; and
   removing the adhesive liquid by drying the substrate.

2. The method of claim 1, wherein the adhesive liquid includes at least one selected from a group consisting of deionized (DI) water, isopropyl alcohol (IPA), ethanol, methanol, and mineral oil.

3. The method of claim 2, wherein the at least one trench includes a plurality of trenches.

4. The method of claim 3, wherein the patterning forms the plurality of trenches parallel to each other.

5. The method of claim 4, wherein both edges of each of the plurality of trenches extend towards a circumference of the substrate when viewed from a plan view.

6. The method of claim 5, wherein at least one pair of neighboring trenches of the plurality of trenches are connected by grooves therebetween.

7. The method of claim 4, wherein each of the plurality of trenches has a width in a range of about 1 μm to about 1000 μm.

8. The method of claim 7, wherein at least one pair of neighboring trenches of the plurality of trenches have a pitch in a range of about 0.1 cm to about 10 cm.

9. The method of claim 1, wherein the protective layer includes at least one material selected from a group consisting of poly methyl methacrylate (PMMA), photoresist (PR), electron resist (ER), silicon oxide (SiOx), and aluminum oxide (AlOx).

10. The method of claim 1, wherein the supporting layer includes at least one material selected from a group consisting of an adhesive tape, a thermal release tape, and an ultraviolet (UV) tape.

11. The method of claim 1, wherein the substrate includes at least one selected from a group consisting of a silicon-on-insulator (SOI) substrate, a plastic substrate, and a glass substrate.

* * * * *